United States Patent
Lythgoe

(10) Patent No.: US 6,541,561 B1
(45) Date of Patent: Apr. 1, 2003

(54) RESIN REINFORCED CROSS-LINKABLE PRINTING INKS AND COATINGS

(75) Inventor: Alan Lennox Lythgoe, Kent (GB)

(73) Assignee: Trip Industries Holding, B.V., Lisse (NL)

( * ) Notice: Subject to any disclaimer, the term of this patent is extended or adjusted under 35 U.S.C. 154(b) by 0 days.

(21) Appl. No.: 09/529,737

(22) PCT Filed: Oct. 22, 1998

(86) PCT No.: PCT/GB98/03168

§ 371 (c)(1),
(2), (4) Date: May 18, 2000

(87) PCT Pub. No.: WO99/20700

PCT Pub. Date: Apr. 29, 1999

(30) Foreign Application Priority Data

Oct. 22, 1997 (GB) .............................................. 9722326
Dec. 24, 1997 (GB) .............................................. 9727274

(51) Int. Cl.$^7$ ........................ C09D 11/10; C08L 27/06; C08J 3/28; C08F 2/48; C08F 2/54; B41N 1/24

(52) U.S. Cl. ........................ 524/551; 523/160; 522/155; 522/909; 427/493; 427/143; 430/308; 525/309

(58) Field of Search ................................. 523/160, 161; 524/551; 522/155, 909; 427/493, 143, 517; 430/308; 525/309, 317

(56) References Cited

U.S. PATENT DOCUMENTS

| | | | | |
|---|---|---|---|---|
| 4,216,019 A | * | 8/1980 | Reed et al. ................. | 430/308 |
| 4,262,084 A | | 4/1981 | Kinney ........................ | 430/308 |
| 4,268,576 A | | 5/1981 | Montmarquet, Jr. ......... | 428/342 |
| 4,270,985 A | | 6/1981 | Lipson et al. ................. | 204/15 |
| 4,286,008 A | * | 8/1981 | Reed et al. .................. | 428/195 |
| 4,481,255 A | * | 11/1984 | Franey et al. ................ | 428/355 |
| 4,575,432 A | * | 3/1986 | Lin et al. ..................... | 252/511 |
| 5,044,761 A | * | 9/1991 | Yuhki et al. ................. | 366/139 |
| 5,565,246 A | * | 10/1996 | Hyde .......................... | 427/504 |
| 6,103,779 A | * | 8/2000 | Guzauskas ................... | 523/115 |

FOREIGN PATENT DOCUMENTS

| | | | |
|---|---|---|---|
| JP | 62-151478 | | 7/1987 |
| JP | 01288367 | * | 11/1989 |
| JP | 03146574 | * | 11/1989 |

OTHER PUBLICATIONS

English Translation of JP 01288367 (1989).*

Lewis Sr., Richard J.; Hawley's Condensed Chenical Dictionary, John Wiley and Sons, New York 1997 (p. 888).*

* cited by examiner

*Primary Examiner*—Vasu Jagannathan
*Assistant Examiner*—Callie E Shosho
(74) *Attorney, Agent, or Firm*—Burns, Doane, Swecker & Mathis, L.L.P.

(57) ABSTRACT

A method is disclosed of making a polymerizable printing ink which comprises mixing a powdered polymer with a liquid composition comprising at least one polymerizable monomer or oligomer, said oligomer or monomer being polymerizable and the powdered polymer being soluble in said liquid composition at elevated temperature.

13 Claims, No Drawings

RESIN REINFORCED CROSS-LINKABLE PRINTING INKS AND COATINGS

BACKGROUND OF THE INVENTION

This invention relates to cross-linkable printing inks and coatings which have particular usefulness in the manufacture of transfers, plastic films and stencils.

In recent years, the use of monomers and oligimers, both separately and as admixtures, curable by ultra violet light or by electron beam radiation has given rise to a new range of materials which are mainly used in the surface coatings industry.

The great advantage of these materials is that by blending low viscosity monomers or oligimers with high viscosity oligimers, or by suitably compounding the oligimers, it has been possible to formulate a large range of compositions which are at the correct viscosity for processing by the normal processes of coating or printing without requiring solvents.

The ability to provide surface coating compositions which are 100% non-volatile has been of great importance for a number of reasons:

First, the absence of volatile solvents ensures an environmentally friendly product.

Secondly, the use of solvents represents an additional cost since they are totally lost having once performed their purpose of reducing viscosity.

Thirdly the loss of solvents in conventional compositions such as, for example printing inks, causes variability during processing which demands greater processing control and these 100% non-volatile liquid compounds remain perfectly stable during the coating or printing processes. After the coating or printing processes have been performed, these compositions can be rapidly or instantly converted by crosslinking using ultra violet light or electron beams.

It is symptomatic of these compositions that the low viscosity monomers or oligimers which are used to adjust viscosity are not removed and are therefore finally part and parcel of the final coating or ink and affect the physical characteristics of the composition.

The formulation of inks and coatings has therefore to take into account the physical properties of the compounds both as processible liquids and finally as crosslinked coatings or inks.

In general, the availability of a range of monomers having various functionalities enables the viscosity to be adjusted whilst also controlling the softness or hardness and the flexibility or strength of the final crosslinked product. In general, monofunctional monomers do not have the high density of crosslinking as multifunctional monomers and are as a consequence more soft and flexible. Similarly the oligimers which have higher molecular weight components also vary in functionality with similar consequences.

Crosslinking of the compounds occurs either by incorporating various well known photo sensitisers which respond to particular wavelengths of light when ultra violet light is used or require no catalyst when the energy for crosslinking is derived from electron beams.

Whilst it is possible to achieve very hard, tough cross-linked films from the use of these compositions, it has, in practice, been impossible to provide tough, hard films which are also free from cracking on flexing. The resulting films do not have the resilience which can be obtained by extruded plastics in which the toughness and flexibility is provided by not only the type of polymer used but by the orientation achieved by extrusion in the molten state.

It is believed that the reason for this ultimate lack of flexibility lies in the fact that the crosslinked molecules are not orientated and are of relatively low molecular weight and are, therefore, in the form of clusters rather than extended linear molecules.

SUMMARY OF THE INVENTION

The present invention is based on the discovery that the disadvantage of the lack of flexibility in otherwise strong and tough UV or electron beam cured films can be overcome by incorporating into the liquid compositions polymeric materials in the form of powders.

According to one aspect of the present invention there is provided a cross-linkable printing ink which comprises a dispersion of a powdered polymer or resin in a liquid composition comprising at least one polymerisable monomer or oligimer.

The invention also includes a method of making a plastics film or transfer which comprises mixing a powdered polymer into a curable liquid composition comprising at least one oligimer or monomer to form an ink, printing said ink on a substrate, heating the printed ink to cause the powdered polymer to dissolve in said composition and then causing said oligimer or monomer to polymerise to form a solid, flexible, cured ink film.

DETAILED DESCRIPTION OF THE INVENTION

In its simplest form the inks of the invention may consist of one or more powdered polymers dispersed in a single liquid polymerisable monomer. The monomer will be polymerisable to form a cured ink film or coating and the toughness and flexibility of the resulting film will depend on a number of factors, including the functionality of the monomer and its interaction with other components of the ink composition. Monofunctional monomers give very soft and sometimes tacky adhesive type cured coatings in compositions with the powdered polymer. Where the functionality is more than one a cross-linked, cured structure is normally obtained. By varying the functionality, it is possible to vary the properties of the film or coating from soft, tacky films to tough, flexible films. It is convenient to prepare a blend of liquid monomers and/or oligimers and to select components which in admixture with the powdered polymer give an ink composition of the desired viscosity and yield a final, cured ink film having the desired physical properties. For example, a monomer of low functionality will tend to introduce softness and flexibility into the cured film, while a multifunctional monomer or oligimer will cause the cured film to exhibit toughness and high strength.

The selection of the monomers and oligimers follows the above stated rules but the addition of polymeric materials in powder form requires further consideration which influence both the viscosity of the liquid form and the final crosslinked coating or ink.

If, for example, the powdered polymer is soluble in the monomer or oligimer, then the viscosity will be affected with the degree of dissolution of the powder. In practice, it is found that certain powdered polymers can be incorporated and remain in a discrete form without noticeable effect on the viscosity, provided the compositions are kept at a relatively low temperature. It is most convenient to use combinations in which the viscosity can be maintained without change for some period of time at room temperature and the powdered polymer is very soluble in the monomers or oligimers at higher temperatures.

It has been found that by selecting the monomers and oligimers or mixtures thereof and equally selecting types of powdered polymers it is possible to enhance the properties of the crosslinked coatings of inks to achieve levels of toughness combined with flexibility hitherto not possible by conventional methods.

Basically, this achievement is thought to be due to the molecular structure which can be introduced by the performed powdered polymer which is not possible when monomers or oligimers crosslink conventionally as clusters, non-linearly.

It is an object of this invention to change the normal consequences of formulation of ultra violet or electron beam curing compositions by the inclusion of powdered polymers or resins such that:

1) the compositions can be converted by coating, printing, or extruding whilst maintaining their viscosity within tolerable processing limits;
2) the powdered polymers or resins can be allowed to modify the final result by being partially or completely dissolved in the monomers or oligimers by the application of heat or other non crosslinking form of energy;
3) the solubilised polymer is permanently incorporated in the crosslinked monomer, oligimer or mixtures thereof.

Whereas it is usually preferable that the compositions covered by this invention contain no solvent whatsoever and are, indeed, 100% non-volatile and are thus extremely friendly to the environment, it is, of course, possible to reduce viscosity using normal organic solvents in which case it is usual then to evaporate the solvents before the crosslinking operation takes place.

In certain cases the solvents may still remain whilst the solubilising of the polymer takes place where the type of solvent can influence the solubility of the powder polymer. The solvent can also be water in certain cases where the crosslinking monomers and oligimers are for example water-soluble.

In most usual cases where the materials are coated, printed, or extruded it is an advantage to coat, extrude, or print the compositions to give maximum thickness and to avoid the use of solvents.

In addition to the powdered polymer, the printing ink compositions of this invention may also include one or more non-reactive polymers which may be pre-dissolved in the liquid composition or in components of the liquid composition, such as in the polymerisable monomer(s) or oligimer(s). Suitable non-reactive polymers include acrylic resins.

The compositions can be pigmented or dyed by grinding pigments into the liquid monomers or polymers, or by dissolving the dyes.

The coating or film of printing ink produced in accordance with the invention are preferably cured or the cure initiated by irradiation. Preferably the cure is effected by irradiation with visible or non-visible light or electron beam radiation. In a preferred embodiment UV light, or electron beam irradiation is employed.

Where UV light is used to effect curing, normal requirements are that the coatings must be transparent to the wavelength of UV light required for crosslinking, although in the case of electron beam radiation curing the pigmentation does not effect the cure in the same way.

If the coatings are encapsulated wet so that the coating is not exposed to the air then curing can be considerably faster.

Where releasable substrates and protective overlays are used in this way then the cured films can be produced as discrete plastic sheets, reels or even small designs.

In a typical production system, the coating or film formed from an ink in accordance with the invention is pre-heated in order to cause the powdered polymer to dissolve in the liquid monomer/oligimer composition. This can be achieved, e.g. by heating with hot air, or infra-red heater or by passing a supported film over a heated roller or plate. Typically the temperature required to achieve this partial or total dissolution will be in the range of 100 to 250° C. In some cases it may be sufficient to cause the powdered polymer to be only partially dissolved in the liquid monomer/oligimer phase at this stage.

After the pre-heating step, the coating or film is then subject to curing by irradiation with UV or electron beam heating. Additional heat may be applied at this stage. In the case of commercial UV dryers, these generally emit significant quantities of heat.

For self supporting articles for example stencils, flexible printed circuits, boxes, decorated sheets for file covers and displays, the coating or film can be cast on a conveyor from which the articles are detached after curing. Such a conveyor could include a polytetrafluoroethylene support in sheet or web form or a cylinder coated with polytetrafluoroethylene to facilitate release of the cured film.

For stickers and transfers and the like, the inks of the invention may be printed or coated on to a temporary support which might be a treated (or suitably low surface tension material) heat resistant plastic or paper.

These materials may be supported on a base or conveyor of suitably heat resistant material or may be unsupported.

The base material may be heated and cured on a carousel type printer, in which the temporary support is affixed to a plate on a rotating system and the print is first moved under a suitable heat source before being next moved under an ultra-violet light source.

Suitable monomers include ethoxylated phenol monoacrylate, tripropylene glycol diacrylate, trimethylpropane triacrylate, ethoxylated trimethylolpropane triacrylate, propoxylated glycerol triacrylate, epoxy acrylate, polyether acrylate, vinyl pyrrolidone, silicone acrylate, polyester acrylate, methacrylates, acrylic acid dimer, beta carboxyethyl acrylate, iso bornyl acrylate, ocyl acrylate decyl acrylate, aliphatic acrylates, pentaerithritol acrylates, 1,6-hexanediol acrylate and polyethylene diacrylate.

Suitable oligimers include epoxy acrylates, polyester acrylates, urethane acrylates, silicone acrylates, amine functional polyether acrylate and chlorinated acrylates.

Synergists can be used to improve crosslinking speeds such as acrylated amines.

Suitable high molecular weight powdered polymers include:

Vinyl chloride/vinyl acetate copolymers of varying degrees of polymerisation and proportions, polyesters etc.

Photoinitiators include benzophenone, 2-hydroxy-2-methyl-1-phenyl-propan-1-one and benzildimethylketaal.

The formulations of these compositions can be generalised as follows:

|                                          | % by weight |
|------------------------------------------|-------------|
| High viscosity UV curing oligimer        | 0–70        |
| Low viscosity UV curing monomer of oligimer | 10–80    |
| Powdered high molecular weight resin     | 10–70       |
| Solvent or water                         | 5–50        |
| Photinitiator                            | 0–5         |

In the case of electron beam radiation no photoinitiator is required. Although the best results are achieved by preheating to the solubilisation point prior to crosslinking, it has been found that a very satisfactory result can be achieved without prior heating. This is more possible with high temperatures generated from the source of light and by the exothermic reaction of the crosslinking reaction.

The following Examples are given of cross-linkable printing inks in accordance with the invention.

EXAMPLE 1

For a composition with the maximum amount of powdered polymer printed by silk screen process:

| | |
|---|---|
| Vinyl chloride/vinyl acetate (4%) copolymer manufactured by microsuspension polymerisation (powdered polymer) | 65 parts |
| ethoxylated phenol monoacrylate (cross-linkable monomer) | 30 parts |
| Tripropylene glycol diacrylate (cross-linkable monomer) | 4 parts |
| 2-hydroxy-2-methyl-1-phenyl propan-1-one (photoinitiator) | 1 part |

The solubilising point of the vinyl chloride/vinyl acetate varies between 100–180 degrees centigrade and the maximum hardness and flexibility of the final cured composition depends on heating the coated layer to a suitable temperature at which the coating becomes relatively clear before crosslinking with UV light. The 2-hydroxy-2-methyl-1-phenyl-propan-1-one can be left out if the crosslinking is carried out by electron beam radiation.

EXAMPLE 2

A water-soluble composition which is non-water soluble after crosslinking

| | |
|---|---|
| Vinyl chloride/vinyl acetate copolymer powder | 50 parts |
| Polyether acrylate monomer | 40 parts |
| Aliphatic urethane acrylate oligimer | 8 parts |
| Benzil dimethylketal (photoinitiator) | 2 parts |

This composition can be diluted with water to a suitable viscosity for processing by coating or printing. The water can be removed prior to solvating the powder polymer and crosslinking by ultra violet light.

EXAMPLE 3

A moderately reinforced composition.

| | |
|---|---|
| Vinyl chloride/vinyl acetate copolymer (powdered polymer) | 20 parts |
| Polyester acrylate (oligimer) | 40 parts |
| Iso bornyl acrylate (monomer) | 20 parts |
| Tripropyl glycol diacrylate (monomer) | 15 parts |
| Benzophenone photoinitiator) | 4 parts |
| Benzildimethylketal photoinitiator) | 1 part |

The coated, printed or extruded composition is first heated to the solubilising temperature and then crosslinked with UV light.

When compared to the result achieved without the inclusion of the vinyl copolymer, the cured composition is tougher but more flexible and elastic.

1. Labels and Decalcomania

These are probably the most important of the uses of the printing inks of this invention.

The background is that up till now labels have been dominated by the manufacturers of self adhesive materials in which a wide range of materials have been made in big volume by very large and dominant companies such as Avery, or Fasson.

These self adhesive materials have been made to fulfil the generalised applications of the industry and rely on the difficulty of converters buying in sufficient bulk to justify prices they would have to pay for small quantities of the plastic films used or for the siliconised paper.

Further the pressure sensitive technology has been too complicated for most converters.

There has been some interest by the larger label producers in producing their own in house self adhesive products which has been helped by the development of UV cured silicone coatings, which make the production of the silicone backing materials much easier to accomplish. The UV cured silicones are 100% non volatile and lend themselves to use in a printing environment. Also the development of in house processing has been aided by the development of 100% non volatile UV curable pressure sensitive materials.

What has been lacking is the ability to print the equivalent of the plastic materials used in the labels, and the requirement of very strong extruded films for the label stock has meant that the requirement to buy the plastic films has been a limiting factor.

This market, therefore, is the prime objective for the products of this invention. The ability to print a plastic film of high quality, tailored to the exact requirements of the specific job is of very great benefit.

Advantages are as follows:

1) The raw material for the liquid plastic ink is inexpensive.
2) Instead of requiring to stock large quantities of varying thickness, varying specification, or various colours only liquid materials require to be kept which can be modified to suit the job in hand and requiring no excess stock.
3) The existing method of using laminated self adhesive plastic films requires that the width of the reels are normally greater than the final requirements and the edge trimming accounts for waste and the slitting of reels can also lead to waste. When using the printed plastic ink of this invention, no wastage of this type occurs.

4) The existing methods of punching out the label shape and removing the unwanted plastic material also leads to waste. With the printed plastic the label is printed to shape without waste.

5) With extruded plastic film there are minimums of production runs which are required for the economic production of the product. This means that the requirement of very special plastics for short run production cannot be dealt with. The use of printed plastic means that the economy or production is the same for long or short runs and the specification of the printed plastic ink can be modified at low cost.

6) The manufacture of extruded film or the like require components of the plastic film necessary to help the extrusion process regardless of their disadvantages to subsequent printing processes. With the liquid printed plastic inks this can be avoided and in fact modifications can be made to ease manufacturing problems specific to the label processors requirement.

7) Label manufacturers can increase their competitive by designing their products in house rather than having to accept the specifications forced on them by suppliers of self adhesive films made to generalised specifications.

2. Production of Stencils

The use of stencils made from plastic sheeting has been growing with the trends towards more DIY decoration.

Stencils are currently produced from preformed plastic sheeting by either mechanical routing or laser cutting.

Both methods depend on producing computer programmes for the tool and the cutting process is slow and expensive.

Using liquid plastic the cost of the process can be reduced and the process speeded up. The number of stencils for any design can be reduced to a single unit since all that is required is to coat the photographic positive and expose to UV through the image side. The clear portions of the image are crosslinked and the uncrosslinked material can be wiped or washed away. The completed stencil can be stripped from the photographic positive.

The stencils can be produced by screen printing when the use of a number of images per operation and the general speed of operation is very competitive.

Stencils can also be produced by using moulds and etched plates etc.

Supported stencils can be produced by coating the liquid plastic on to a photographic positive and laminating on to a mesh and then curing through the positive. Excess uncrosslinked material can be removed by wiping or washing.

The mesh supported stencils can also be produced by screen printing the plastic ink.

These stencils represent a big advantage over unsupported stencils in that stencils can be reproduced having extremely fine details and also the areas (like for example the centres of letters or the fine details from a photograph) can be supported on the mesh.

The stencils produced in this manner can be made self adhesive by the printing down first of a shearable adhesive followed by the UV curable composition, for example, or by over printing the cured UV composition either in register with high tack non-shearable, pressure-sensitive materials, or overall with shearable adhesives.

The resin reinforced films of this invention may be laminated with a UV curing adhesive. The lamination may be carried out prior to curing and both cured at the same time. Printing of the plastic ink may be followed by non contact printing and by coating with UV adhesive and curing.

Conveniently, the plastic printing ink is cured through stencil or photographic image to required shape, followed by removal of excess liquid or transposition of plastic image.

It is also possible to combine coating of liquid plastic with an adhesive coated on the upper surface of ink and the laminate cured through a stencil or photographic image to define the shape of the indicium, followed by delamination and removal of excess non-cured materials.

Films of the ink can be formed by coating or spraying over a mould. Curing need only be effected in the area required.

Inflated moulds may be employed which are coated by spraying, cured to define the desired shape and the mould then deflated to leave shaped item.

Films or shaped designs may be formed by coating, printed or sprayed on a support surface and cured through stencil or photographic image. Excess liquid is then removed and designs then over-printed digitally by non-contact printing. The resulting design can then be laminated with dot tint adhesive. The adhesive can be UV cured or can be of the conventional solvent-dried type.

3. Other Uses

The resin reinforced UV curable liquids can be used as conventional paints or coatings by dipping, spraying, brushing etc. onto any objects. Objects can be preheated to dissolve the dispersed PVC powders into the liquid polymers before crosslinking.

It is possible to manufacture transfers using the conventional pressure-sensitive adhesives or UV curable adhesives printed either before or after the UV curable layer, and being either in register or overall if shearable or alternatively use the process of pattern printing for non-shearable adhesives as described in UK Patent Application No. 9721959.6.

The adhesives can be printed first onto a siliconised release layer which is subsequently laminated to the UV cured composition. The adhesive can be applied by coating, spraying or by screen process printing or by ink jet for example.

The graphic elements of decoration of the cured UV composition can be achieved by conventional printing inks and processes or by digital printing or laser copying or by ink jet or sublimation dye processes.

When the resin reinforced UV crosslinkable composition is printed or coated and used in conjunction with a pressure sensitive adhesive, the adhesive can be applied over the coating without necessarily curing the coating first. In the case of a UV curable adhesive, the adhesive can then be cured by UV or by electron beam radiation and in the same process, together with the heating stage, the resin reinforced coating will also be cured. The interfilm adhesion is naturally enhanced and the curing operation reduced to one stage. In the case of conventional adhesives, the solvent would be evaporated first before applying the reinforced UV cross-linkable composition. If the adhesive were coated onto a silicone release paper or film and applying the reinforced composition second, then the operation could be reversed, again optionally curing the two layers either separately or in one operation.

The use of the printing inks of this invention has been described above for printing specific desired shapes, thereby avoiding the need to punch or cut a preformed laminate.

Another important application of the inks is in the production of laminates by forming fold or score lines at the same time as depositing a film of the inks. Thus, a laminate can be formed which has 'built-in' fold or crease lines which are inherently weaker or more flexible than surrounding areas.

This can be accomplished by, for example, printing a line of dots which may be quite large or small and non-continuous such that the strength of the polymerised film or coating in the non-continuous areas is sufficient for the purpose of providing the folded object. Alternatively, the film or coating may be arranged to be sufficiently strong to provide the fold but sufficiently weak to allow an area to be torn away along the fold if required. These properties can be achieved by selecting the strength of the formulated, reinforced, UV-crosslinkable composition, the thickness of the film printed and the size of dots and the frequency of dots printed on the area of the fold.

Secondly, a fold can be established by printing multiple layers of the composition such that lines are created having less thickness and strength than the surrounding areas. For example, an overall area can be printed giving a thickness of deposit which will provide sufficient strength for the flexing of the plastic sheet thus formed. A second print, either printed overall except for the thickness of the fold line or, perhaps, adjacent to either side of the proposed folded line, such that the weakness of this line compared to the surrounding plastic, enables the fold to be easily made.

If, for example, an A3 sheet was to be printed so as to be folded into an A4 binder, the A3 sheet would be first printed overall at, say, 20 microns thickness. The first printed layer would then be overprinted with a layer of; say, 50 microns thickness, leaving an unprinted area of; say, 3 mm wide to make the fold. The finished A4 binder would be a laminate having a plastic layer of 70 microns thickness with a 3 mm fold of 20 micron thick plastic material. Obviously, the fold would be a weaker line than the surrounding plastic.

It may be preferred to only print on either side of the fold line with a narrow band on either side of the fold, leaving the majority of the binder at the same thickness of the material forming the fold.

In this second case, one or more layers could also be printed with a line of dots as before.

What is claimed is:

1. A method of making a plastics film or transfer, comprising mixing a powdered polymer into a curable liquid composition comprising at least one oligomer or monomer which is polymerizable by light or electron beam irradiation, forming a coating of said composition on a substrate, heating the coating to a temperature effective to cause the powdered polymer to fully dissolve in said composition and then initiating polymerization of said oligomer or monomer to form a solid, flexible, cured film, wherein the method further comprises separating the film from the substrate to produce a separate solid film.

2. The method as claimed in claim 1, wherein the oligomer or monomer has unsaturated groups which are polymerizable by free-radical polymerization.

3. The method as in claim 1, wherein the light is UV light.

4. The method according to claim 1, wherein the curable liquid composition is substantially solvent-free.

5. The method according to claim 1 in which the curable composition is coated, printed or extruded onto the substrate.

6. The method as claimed in claim 1 wherein the monomers comprise at least two monomers having the same or different functionality.

7. The method according to claim 1 wherein the powdered polymer is a polyvinyl chloride or a vinyl chloride/vinyl acetate copolymer.

8. The method according to claim 7, wherein the polyvinyl chloride or vinyl chloride/vinyl acetate copolymer is present in an amount of from 10% to 70% by weight of the liquid composition.

9. The method according to claim 1, wherein the coating is heated to a temperature of from about 100–250° C.

10. A method of making a stencil, comprising forming on a support a film of a polymerizable ink, said ink comprising at least polymerizable oligomer or monomer having a powdered polymer dispersed therein, heating the film to a temperature effective to cause the powdered polymer to fully dissolve in the oligomer or monomer, exposing the film to polymerization radiation through a negative or positive mask and then washing away with solvent unexposed areas of said film, wherein the method further comprises separating the film from the support to produce a separate solid film.

11. The method according to claim 10, wherein the film is heated to a temperature of from about 100–250° C.

12. A method of making a plastics film or transfer, comprising printing on a support a film of a polymerizable ink, said ink comprising at least one polymerizable liquid oligomer or monomer having a powdered polymer dispersed therein, heating the printed ink film to a temperature which is sufficient to cause the powdered polymer to dissolve in the oligomer or monomer and then causing the ink to cross-link by irradiation with UV light or electron beam radiation, wherein the method further comprises separating the film from the support to produce a separate solid film.

13. The method according to claim 12, wherein the film is heated to a temperature of from about 100–250° C.

* * * * *